United States Patent [19]
Wilson et al.

[11] Patent Number: 5,284,287
[45] Date of Patent: Feb. 8, 1994

[54] METHOD FOR ATTACHING CONDUCTIVE BALLS TO A SUBSTRATE

[75] Inventors: Howard P. Wilson; Fonzell D. J. Martin, both of Austin, Tex.

[73] Assignee: Motorola, Inc., Schaumburg, Ill.

[21] Appl. No.: 937,267

[22] Filed: Aug. 31, 1992

[51] Int. Cl.$^5$ ............................................. H01L 21/58
[52] U.S. Cl. ................... 228/180.2; 427/96; 228/254
[58] Field of Search ............ 228/180.2, 246, 254; 118/425; 427/96

[56] References Cited

U.S. PATENT DOCUMENTS

| | | | |
|---|---|---|---|
| 2,068,250 | 1/1937 | Thomas | 118/425 |
| 2,601,307 | 6/1952 | Meyer et al. | 118/425 |
| 4,462,534 | 7/1984 | Bitaillov et al. | 228/246 X |
| 4,558,812 | 12/1985 | Bailey et al. | 228/180.1 |
| 4,871,110 | 10/1989 | Fukasawa et al. | 228/245 |
| 5,088,639 | 2/1992 | Gondotra et al. | 228/246 X |
| 5,118,027 | 6/1992 | Braun et al. | 228/180 |
| 5,170,931 | 12/1992 | Desai et al. | 228/180.2 |

OTHER PUBLICATIONS

Research Disclosure Document No. 271009, identified as "Solder Ball Alignment Device by Applying Vacuum to Template Via Plenum," published Nov. 10, 1886. Author not yet known.
Research Disclosure Document No. 316084, identified as "Integrated Surface Mount Module I/O Attachment," published Aug. 10, 1990. Author not yet known.

Primary Examiner—Kenneth J. Ramsey
Attorney, Agent, or Firm—Patricia S. Goddard

[57] ABSTRACT

Conductive balls (44), preferably solder balls, are attached to pads (32) on a substrate (30) using a vacuum pick-up tool (34). The pick-up tool lowers the conductive balls into a bath of flux (48) without allowing the balls to touch the bottom of a recess (47) in a flux plate (46), thereby reducing the likelihood of dislodging the solder balls from the pick-up tool. The pick-up tool withdraws the balls from the flux, and aligns the balls with the respective pads on the substrate. Once positioned, the balls are released from the pick-up tool. A reflow operation metallurgically bonds the balls to the pads.

16 Claims, 5 Drawing Sheets

METHOD FOR ATTACHING CONDUCTIVE BALLS TO A SUBSTRATE

FIELD OF THE INVENTION

The present invention relates to methods for attaching conductive balls to a substrate, and more specifically to methods for attaching conductive balls to substrates used in semiconductor devices.

BACKGROUND OF THE INVENTION

In an effort to alleviate handling problems and difficult surface mounting procedures associated with fine-pitch leads of semiconductor devices, some semiconductor manufacturers are building devices in packages which do not employ conventional leads. One such device is the over-molded pad array carrier (OMPAC) device. OMPAC devices have conductive balls, typically solder balls, which are arranged in an array configuration on a bottom surface of a circuitized substrate. The solder balls serve as the external electrical terminals of the device, similar to conventional leads or pins.

One method to manufacture OMPAC devices begins with a semiconductor die mounted to a circuitized substrate. The circuitized substrate typically includes conductive traces on both a top and a bottom surface of the substrate and conductive through-holes or vias which electrically couple the top and bottom traces. The die is electrically coupled to conductive traces on the top surface by, for instance, wire bonds. The die, wire bonds, and a portion of the top surface of the substrate are encapsulated with a resin molding compound. After encapsulation, a solder ball is attached to a terminating end of each of the conductive traces on the bottom surface of the circuitized substrate. The terminating ends of the traces are often formed in the shape of pads and are typically arranged in an array configuration, thus the name "pad array" device.

An existing process for attaching solder balls to the pads on the bottom of a circuitized substrate involves using a vacuum pick-up tool to transfer the solder balls onto the substrate. The pick-up tool picks up a plurality of solder balls such that the balls are arranged in the final array configuration corresponding to the pad configuration on the bottom of the substrate. The pick-up tool then transfers the balls to a flux bath and the balls are partially immersed in the flux. After being coated with flux, the solder balls are transferred to the bottom surface of the substrate such that the balls are aligned with the pads. The solder balls are released from the pick-up tool and reflowed to form a metallurgical bond between each ball and a respective pad.

In practicing the solder ball attachment method described above, a problem of loosing solder balls sometimes occurs during the fluxing procedure. Upon withdrawing the pick-up tool and the solder balls from the flux bath, some solder balls can become dislodged from the tool. If a solder ball is displaced from the pick-up tool, remaining solder balls must be released from the pick-up tool. The pick-up tool then picks up a new set of solder balls and the attachment procedure begins again.

Repeating solder ball attachment operations wastes a significant amount of manufacturing time, thereby increasing costs of OMPAC devices. One solution to the problem of displaced solder balls is to slow the rate at which solder balls are immersed into a flux bath, and also to slow the rate at which the solder balls are withdrawn from the flux bath. While this solution reduces the chance of dislodging a solder ball from the pick-up tool, the slower manufacturing step undesirably increases manufacturing time which in turn increases device cost. Therefore, a less costly and time-consuming solution to the problem of displaced solder balls would be useful.

SUMMARY OF THE INVENTION

The present invention overcomes the problems associated with the existing solder ball attachment method discussed above. In one form of the invention, conductive balls are attached to a substrate by the following method: providing a substrate having a plurality of conductive ball receiving areas; providing a pick-up tool having a plurality of conductive balls held therein by a vacuum; providing a flux plate having a recess formed therein, wherein the recess has a bottom surface and is filled with flux; lowering the pick-up tool toward the flux plate until each conductive ball is partially immersed in the flux without allowing any of the conductive balls to touch the bottom surface of the recess; raising the pick-up tool to remove the conductive balls from the flux; aligning the fluxed conductive balls in the pick-up tool with the conductive ball receiving areas of the substrate; releasing the conductive balls from the pick-up tool, and reflowing the conductive balls to metallurgically bond each conductive ball to a corresponding conductive ball receiving area of the substrate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

FIG. 2 is a plan view of a substrate onto which a plurality of conductive balls are to be attached;

FIG. 3 is a cross-sectional view of a pick-up tool securing a plurality of conductive balls therein;

FIG. 4 is a cross-sectional view of the pick-up tool fluxing the conductive balls secured therein;

FIG. 5 is an exploded cross-sectional view of a portion of the pick-up tool immersing a conductive ball into a flux;

FIG. 6 a cross-sectional view of the pick-up tool aligning the conductive balls to pads on the substrate;

FIG. 7 is an exploded cross-sectional of the substrate having the conductive balls attached thereto, prior to a reflow operation; and FIG. 8 is a plan view of the substrate having the plurality of conductive balls attached thereto.

DETAILED DESCRIPTION OF A PREFERRED EMBODIMENT

Figure 1:
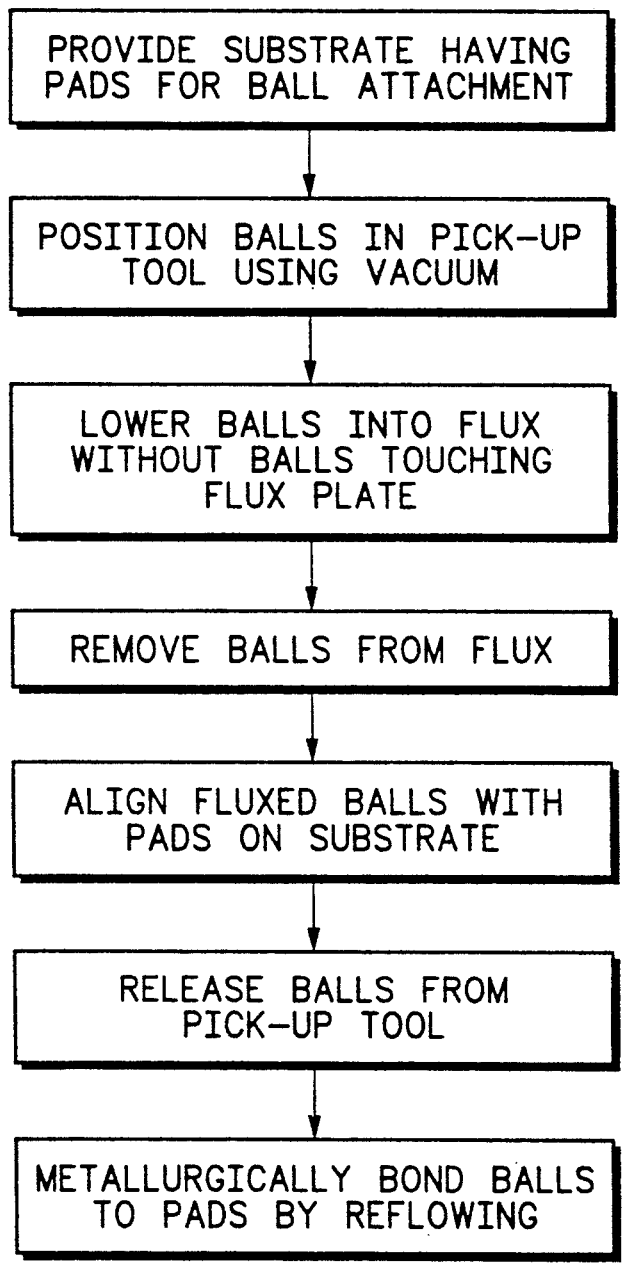
FIG. 1 is a process flow in accordance with the present invention.

The present invention alleviates the previously described problem of displaced solder balls without any increase in manufacturing time, and in some instances reduces manufacturing time in comparison to existing solder ball attachment methods. In addition, the occurrence of displaced solder balls while practicing the present invention is very rare, thereby minimizing the number of redundant manufacturing steps. While an existing solution to displaced solder balls emphasizes the speed at which the balls are immersed and withdrawn from the flux, the present invention emphasizes the geometry of a flux bath or flux plate in relation to the dimensions of the solder balls. FIG. 1 illustrates a process flow 10 in accordance with the present invention in which the relationship between the balls and the flux plate is described. The process flow of FIG. 1 is also illustrated graphically in FIGS. 2–8, which will be described in more detail below. First, a substrate having pads for receiving solder balls, or other conductive balls, is provided. The solder balls are placed in a pick-up tool using a vacuum. The pick-up tool then lowers the solder balls into a flux bath such that the solder balls do not touch the bottom surface of a flux plate which contains the flux. The pick-up tool removes the solder balls from the flux and aligns the fluxed balls to the pads on the substrate. The solder balls are then released from the pick-up tool and are reflowed to become metallurgically bonded to the pads.

In the existing solder ball attachment method described earlier, solder balls are immersed into a flux until the solder balls hit the bottom of a flux plate containing the flux. The flux in the flux plate has a depth equal to the amount of flux a manufacturer desires on each solder ball, as determined through manufacturing optimization. Thus, the pick-up tool holding the solder balls need not control how far to immerse the solder balls into the flux. The balls are simply immersed until the bottom of the flux plate is contacted. By slowing the rate at which solder balls are immersed, the force at which the solder balls hit the flux plate is reduced. Consequently, fewer and fewer solder balls are dislodged from the pick-up tool as the immersion rate is reduced. However, as pointed out above, the slower immersion rate undesirably increases manufacturing time.

The present invention resolves the problem of dislodged solder balls without slowing the manufacturing process. The problem of dislodged solder balls was discovered to be caused by the solder balls contacting the flux plate, not by the rate at which the solder balls were immersed in or withdrawn from the flux. In the prior art method, contact between the solder balls and the flux plate was used to set the immersion depth. In the present invention, immersion depth is set by precisely controlling the depth to which the balls are immersed with the pick-up tool without allowing the solder balls to contact the flux plate. A graphic representation of one embodiment of the present invention is illustrated in FIGS. 2–8 and is described below.

Figure 2:
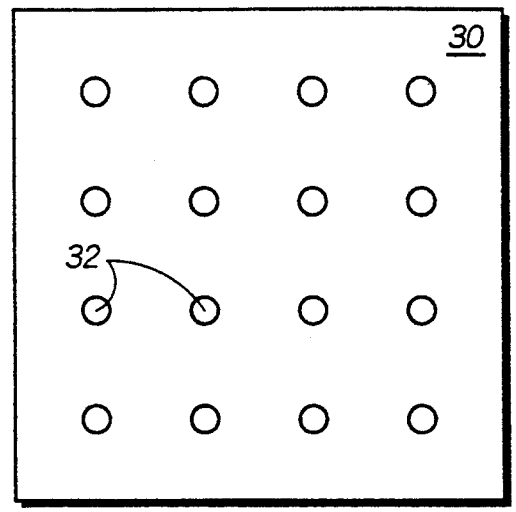
FIGS. 2-8 are a series of illustrations demonstrating an example of the process flow of FIG. 1. More specifically.

FIG. 2 is a plan view of a substrate 30 having a plurality of exposed ball receiving areas or pads 32 to which solder balls, or other conductive balls, are to be attached. Substrate 30 need not be of a specific material. The present invention is particularly applicable to manufacturing semiconductor devices; therefore, substrate 30 may be a substrate material common to the semiconductor industry. Such materials include, but are not limited to, ceramics, printed circuit board materials, flexible circuits, and the like. Pads 32 should be of a material which will form a metallurgical bond with the particular type of conductive balls which are to be attached. Typically, pads 32 will be formed from a metal, for example copper, nickel, or gold. Metal regions other than pads 32 may be present on substrate 30. Furthermore, an insulating layer, for instance a solder resist mask, may overlie substrate 30 and define openings which expose pads 32.

Figure 3:
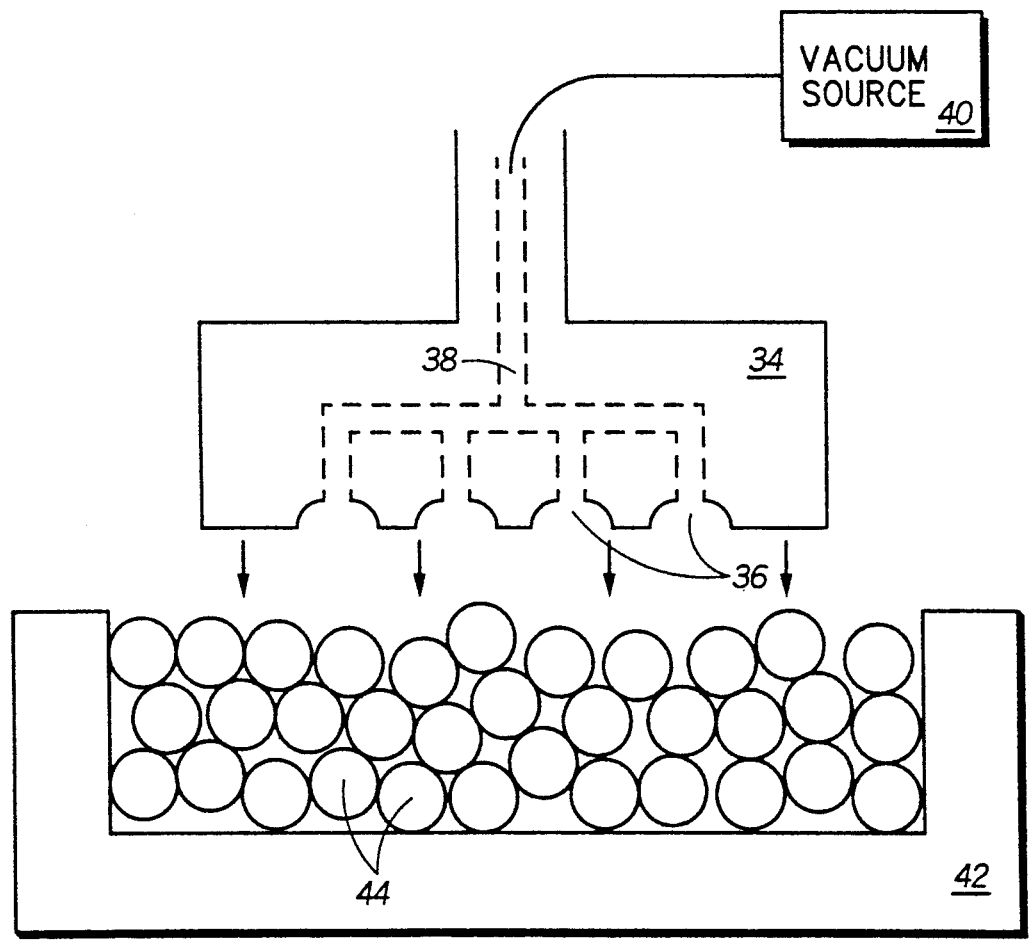

FIG. 3 illustrates in cross-section a pick-up tool 34 suitable for use with the present invention. Pick-up tool 34 has a plurality of solder ball receiving cavities 36 formed therein. The cavities in pick-up tool 34 are configured to match the arrangement of pads 32 on substrate 30. Each cavity 36 is coupled to a vacuum channel 38. A vacuum source 40 is connected to pick-up tool 34 such that a vacuum is pulled through channel 38 in order to hold a solder ball 44 into each cavity of the pick-up tool. It is important point out that although the term "solder ball" is used throughout the description, the present invention can be practiced using any type of conductive ball, such as copper balls, solder coated balls, and the like. To position solder balls 44 into cavities 36 of pick-up tool 34, the tool is lowered toward a container 42 which holds an abundance of solder balls. The vacuum being pulled through channel 38 draws a solder ball into each cavity of the pick-up tool.

Figure 4:
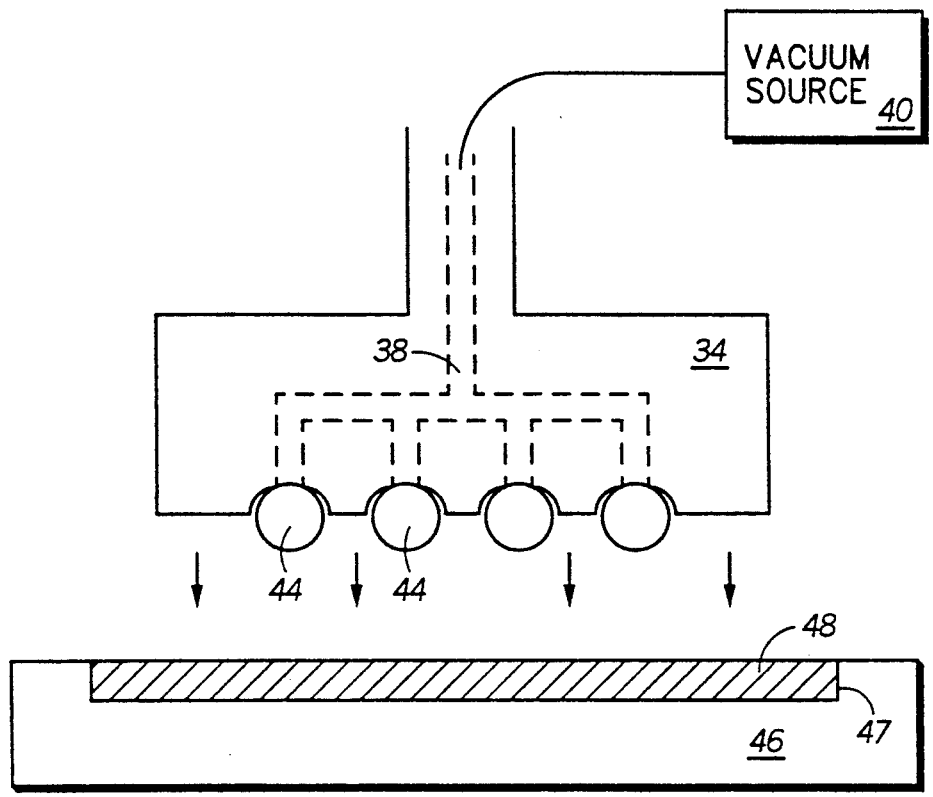
Figure 5:
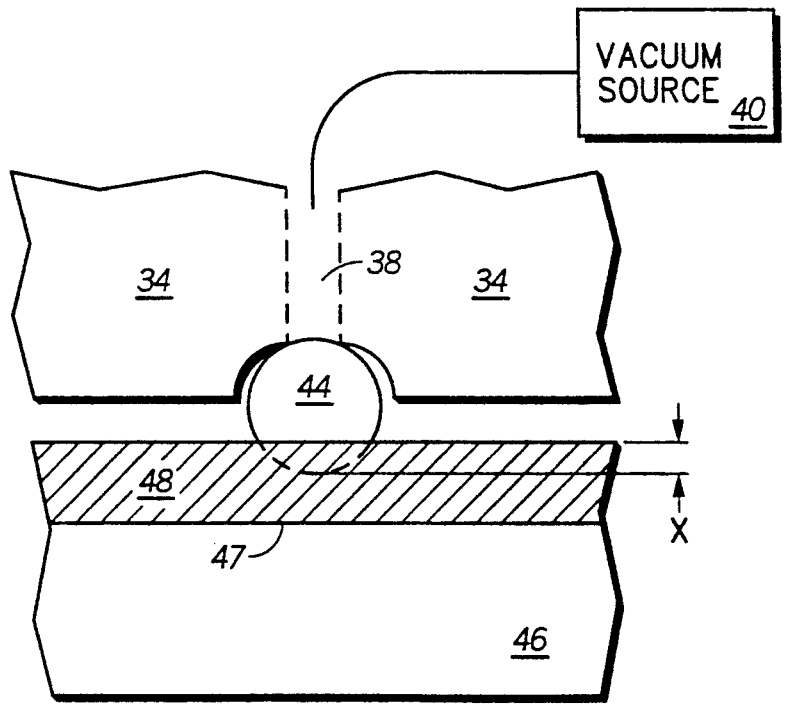

Once the solder balls are arranged in the pick-up tool cavities, pick-up tool 34 positions solder balls 44 over a flux plate 46 which has a recess 47 formed therein. A flux material 48 fills recess 47, as illustrated in FIG. 4. The pick-up tool then lowers the solder balls until each ball is partially immersed in the flux to a predetermined depth. FIG. 5 is an exploded cross-sectional view of pick-up tool 34 immersing solder ball 44 into flux 48. As shown in FIG. 5, solder ball 44 is immersed to a depth "X". In accordance with the present invention, depth "X" is smaller than the total depth of flux 48 so that solder ball 44 does not touch the bottom of recess 47, or in other words does not touch flux plate 46. Depth "X" should be optimized for the particular manufacturing process at hand. If depth "X" is too small, solder ball 44 may not adequately attach to pads of a substrate. On the other hand, if depth "X" is too large, there is a risk that pick-up tool 34 will become contaminated with flux making subsequent release of the solder balls from the pick-up tool more difficult. A suitable immersion depth is approximately between 20% and 30% of the diameter of each solder ball. The present invention is especially useful in attaching small solder balls, for instance balls having a diameter of 20–40 mil (0.50–1.00 mm).

In practicing the present invention, pick-up tool 34 is used to control the depth to which the solder balls are immersed, unlike the prior art method in which the depth of the flux bath controls immersion depth. Because the depth to which solder balls are immersed is important to a successful manufacturing process, lowering the solder balls into the flux bath is a more critical step than withdrawing the solder balls from the flux. If the pick-up tool is lowered too fast, it is difficult to accurately control its stopping position. Overshooting the stopping point may result in contaminating the pick-up tool with flux and/or allowing the solder balls to hit the bottom of the flux plate, both of which possibilities are undesirable. Therefore, in accordance with the present invention, it is suggested that the rate at which solder balls are immersed into the flux be slower than the rate at which the balls are withdrawn. Recall that in the prior art method, both the immersion rate and withdrawal rate are slow in order to prevent solder balls from being dislodged from the pick-up tool. With the present invention, withdrawal rate is considerably faster than the prior art method. The faster withdrawal rate results in a shorter manufacturing time, and is also thought to be advantageous because the adhesion between the flux and the solder balls is more easily broken. Even though it is suggested that the immersion rate be slower than the withdrawal rate, the immersion rate can also be faster than that used in the prior art method since the solder balls do not come into contact with the bottom of the flux plate. Furthermore, the immersion rate should be slower only to guarantee the proper solder ball immersion depth. If the pick-up tool accuracy is sufficiently high, a slower immersion rate may not be necessary.

Figure 6:
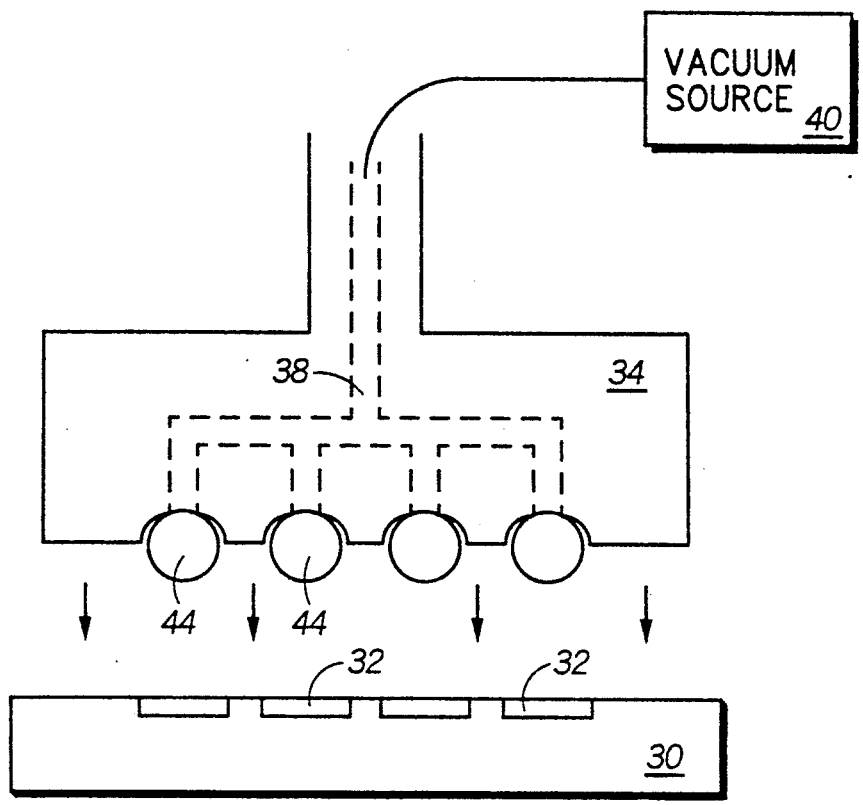
Figure 7:
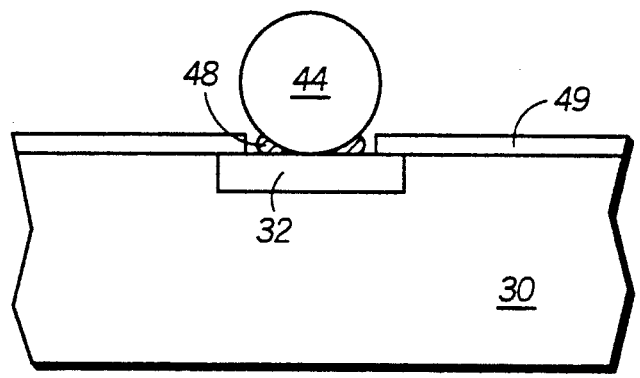

After solder balls 44 are properly immersed in flux 48, pick-up tool 34 is raised and positions the fluxed solder balls above substrate 30, as illustrated in a cross-sectional view in FIG. 6. The pick-up tool aligns the solder balls with pads 32 of the substrate and then lowers the solder balls until each ball is in contact with a corresponding pad. Once the solder balls are aligned with the pads, the vacuum in channel 38 is released and the solder balls are in position on substrate 30. FIG. 7 is a cross-sectional exploded view of solder ball 44 positioned on pad 32 of substrate 30. Flux 48 surrounds the portion of solder ball 44 which is adjacent pad 32. Also illustrated in FIG. 7 is a solder resist mask 49. Solder resist masks are commonly used on substrates to prevent solder from wetting certain portions of the underlying substrate.

Figure 8:
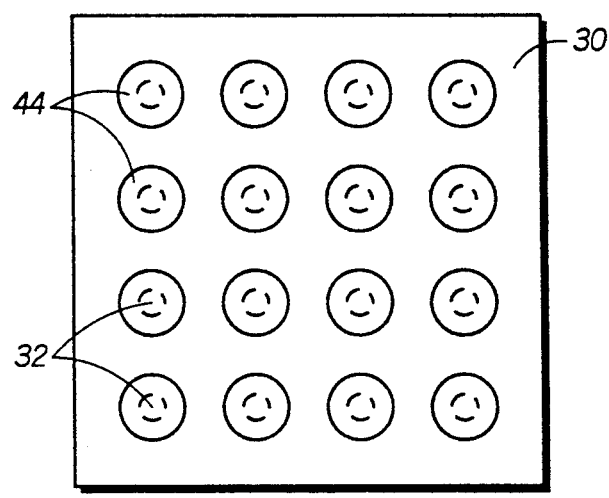

Once solder balls 44 are positioned properly on pads 32, a conventional reflow operation is performed to form metallurgical bonds between the pads and solder balls. As a normal result of the reflow operation, solder balls 44 may flatten against pads 32 of substrate 30 so that the balls are no longer completely spherical. FIG. 8 is a plan view of substrate 30 having solder balls 44 attached thereto in accordance with the present invention.

Figure 9:
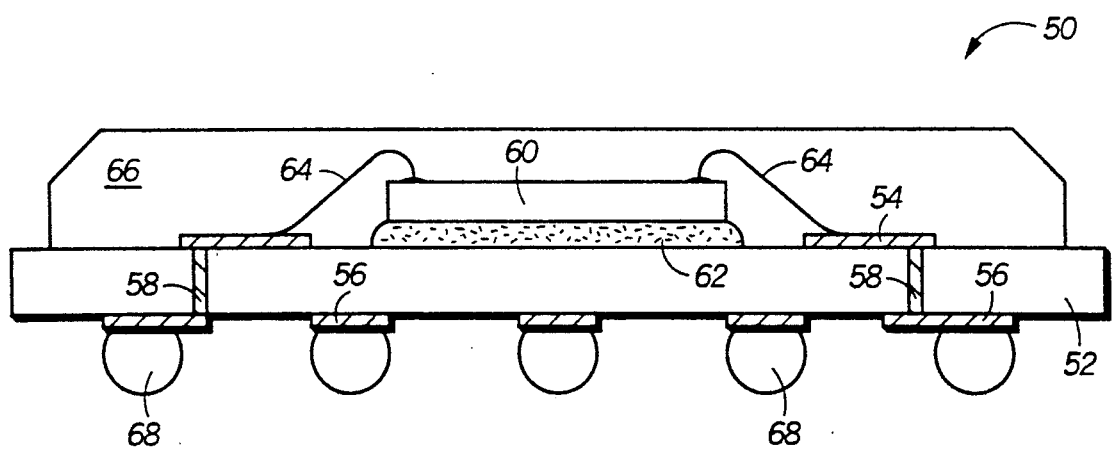
FIG. 9 is a cross-sectional view of a semiconductor device made using a process in accordance with the present invention.

FIG. 9 illustrates in a cross-sectional view an overmolded pad array carrier (OMPAC) semiconductor device 50 made in accordance with the present invention. Device 50 includes a circuitized substrate 52 having a plurality of conductive traces 54 and conductive pads 56. A conductive through-hole or via 58 electrically couples each trace to a pad (not all connections are illustrated). A semiconductor die 60 is attached to a top surface of substrate 52 using a conventional die attach adhesive 62. Die 60 is electrically coupled to traces 54 by standard wire bonds 64. The die, wire bonds, traces, and a portion of the top surface of the substrate are encapsulated with a molded plastic package body 66. A plurality of solder balls 68 is attached to pads 56 in accordance with the present invention as described above.

In a preferred form, substrate 52 of device 50 is a resin, such as an epoxy, polyimide, triazine, or phenolic resin. More specifically, a bismaleimide-triazine (BT) resin is preferred; however other substrate materials are also suitable. For instance, various epoxy-glass composites, printed circuit board (PCB) materials, flexible circuits, or ceramic substrates may be used. Conductive traces 54 and pads 56 are typically formed on substrate 52 by laminating a conductive foil, usually copper, to the substrate. Traces and pads are then defined by patterning the foil using lithography techniques. Alternatively, traces and pads may be screen pointed or otherwise deposited onto surfaces of the substrate. Both the conductive traces and pads are typically plated with gold to establish a non-oxidizable surface for bonding wire bonds 64 and attaching solder balls 68. Conductive vias 58 are typically formed in substrate 52 by drilling or punching holes through the substrate and subsequently plating or filling the holes with copper, nickel, gold, or other metal.

The foregoing description and illustrations contained herein demonstrate many of the advantages associated with the present invention. In particular, it has been revealed that solder ball attachment in accordance with the present invention results in a lower incidence of solder ball displacement from a vacuum pick-up tool, thereby increasing manufacturing yields and reducing rework. Moreover, a method of the present invention provides a significant reduction in cycle-time in comparison to prior art methods. Yet another advantage is that the present invention requires only a minimal modification to existing equipment. The only equipment modification needed is a properly designed flux plate having a flux bath which is deeper than the desired immersion depth.

Thus it is apparent that there has been provided, in accordance with the invention, a method for attaching conductive balls to a substrate that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is applicable to attaching any type of conductive ball onto a substrate and is not limited to attaching solder balls. In addition, the invention is not limited to attaching conductive balls to semiconductor devices. It is also important to note that the present invention may be practiced as a batch or strip operation. In other words, solder balls can be attached to more than one substrate or more than one substrate area at a time. Furthermore, conductive balls which are attached in accordance with the present invention need not be in an array configuration. Therefore, it is intended that this invention encompass all such variations and modifications as fall within the scope of the appended claims.

We claim:

1. A method for attaching conductive balls to a substrate comprising the steps of:

providing a substrate having a plurality of conductive ball receiving areas;

providing a pick-up tool having a plurality of conductive balls held therein by a vacuum, each conductive ball having a diameter;

providing a flux plate having a recess formed therein, the recess having a bottom surface and being filled with a flux;

lowering the pick-up tool toward the flux plate until each conductive ball is partially immersed in the flux, but without allowing any conductive balls to touch the bottom surface of the recess and without allowing the pick-up tool to come in contact with the flux;

raising the pick-up tool to remove the conductive balls from the flux;

aligning the pick-up tool having the fluxed conductive balls therein to the substrate such that each conductive ball is in contact with a corresponding one of the plurality of conductive ball receiving areas;

releasing the conductive balls from the pick-up tool; and reflowing the conductive balls to metallurgically bond each conductive ball to the corresponding conductive ball receiving area of the substrate.

2. The method of claim 1 wherein the step of providing a substrate comprises providing a substrate comprised of a material selected from the group consisting of: a flexible circuit, an epoxy-glass composite, a ceramic, a polyimide, an epoxy resin, a triazine resin, and a phenolic resin.

3. The method of claim 1 wherein the step of providing a pick-up tool having a plurality of conductive balls held therein comprises providing a pick-up tool having a plurality of solder balls held therein.

4. The method of claim 1 wherein the step of lowering the pick-up tool toward the flux plate comprises lowering the pick-up tool until each conductive ball is immersed in the flux to a depth equal to approximately 20% to 30% of the diameter of each conductive ball.

5. The method of claim 4 wherein the step of providing a pick-up tool having a plurality of conductive balls held therein comprises providing a pick-up tool having a plurality of solder balls held therein, wherein each solder ball has a diameter equal to between approximately 0.5 and 1.0 mm.

6. A method for attaching conductive balls to a substrate comprising the steps of:

providing a plurality of solder balls, each solder ball having a diameter;

providing a substrate having a plurality of solder ball receiving pads in a predetermined configuration;

providing a pick-up tool having a plurality of solder ball receiving cavities formed therein and matching the predetermined configuration;

placing one solder ball in each one of the plurality of solder ball receiving cavities in the pick-tool;

holding the plurality of solder balls in the plurality of solder ball receiving cavities by applying a vacuum through the pick-up tool;

providing a flux plate having a recess formed therein, the recess having a bottom surface and being filled with a flux;

positioning the pick-up tool having the plurality of solder balls held therein over the flux plate;

lowering the pick-up tool toward the flux plate until a predetermined portion of each solder ball is immersed in the flux, and without any of the plurality of solder balls touching the bottom surface of the recess in the flux plate;

raising the pick-up tool to remove the plurality of solder balls from the flux; and attaching the fluxed solder balls to the substrate such that each solder ball corresponds to one of the solder ball receiving areas.

7. The method of claim 6 wherein the step of attaching the fluxed solder balls comprises the steps of:

aligning the pick-up tool having the fluxed plurality of solder balls held therein with the plurality of solder ball receiving pads of the substrate;

lowering the pick-up tool until each solder ball is in contact with a respective one of the plurality of solder ball receiving pads;

releasing each solder ball from the pick-up tool by removing the vacuum; and reflowing the solder balls to form a metallurgical bond between each solder ball and the respective solder ball receiving pad.

8. The method of claim 6 wherein the step of lowering the pick-up tool toward the flux plate is performed at a slower rate than the step of raising the pick-up tool.

9. The method of claim 6 wherein the step of lowering the pick-up tool toward the flux plate comprises lowering the pick-up tool toward the flux plate until approximately 20% to 30% of the diameter of each solder ball is immersed in the flux.

10. The method of claim 6 wherein the step of providing a substrate comprises providing a substrate having a plurality of solder ball receiving pads arranged in an array configuration.

11. A method for attaching conductive balls to a substrate for use in a semiconductor device comprising the steps of:

providing a substrate having a first and a second opposing surface, a plurality of conductive traces formed on the first surface, and a plurality of conductive pads formed on the second surface, each conductive pad being electrically coupled to a corresponding one of the plurality of conductive traces;

providing a semiconductor die;

attaching the semiconductor die to the first surface of the substrate;

electrically coupling the semiconductor die to the plurality of conductive traces;

providing a plurality of solder balls, each solder ball having a diameter;

attaching the plurality of solder balls to the conductive pads on the second surface of the substrate;

wherein the step of attaching the plurality of solder balls comprises the steps of:

providing a pick-up tool having the plurality of solder balls held therein by a vacuum;

providing a flux plate having a recess formed therein, the recess having a bottom surface and being filled with a flux;

lowering the pick-up tool toward the flux plate until each solder ball is partially immersed in the flux, but without allowing any of the solder balls to touch the bottom surface of the recess;

raising the pick-up tool to remove the solder balls from the flux;

aligning the pick-up tool having the fluxed solder balls therein to the substrate such that each conductive ball is in contact with a corresponding one of the plurality of conductive pads;

releasing the conductive balls from the pick-up tool; and reflowing the conductive balls to metallurgically bond each conductive ball to the corresponding conductive pad of the substrate.

12. The method of claim 11 wherein the step of providing a substrate comprises providing a substrate comprised of a material selected from the group consisting of: a flexible circuit, an epoxy-glass composite, a ceramic, a polyimide, an epoxy resin, a triazine resin, and a phenolic resin.

13. The method of claim 11 further comprising the step of encapsulating the semiconductor die and portions of the first surface of the substrate with a molded plastic body.

14. The method of claim 11 wherein the step of providing a substrate comprises providing a substrate having a plurality of conductive pads arranged in an array configuration on the second surface of the substrate.

15. The method of claim 11 wherein the step of lowering the pick-up tool toward the flux plate comprises lowering the pick-up tool toward the flux plate until approximately 20% to 30% of the diameter of each solder ball is immersed in the flux.

16. The method of claim 15 wherein the step of providing a plurality of solder balls comprises providing a plurality of solder balls wherein each solder ball has a diameter equal to between approximately 0.5 and 1.0 mm.

* * * * *